(12) United States Patent
Teramoto

(10) Patent No.: US 9,971,450 B2
(45) Date of Patent: *May 15, 2018

(54) TOUCH PANEL

(71) Applicants: Japan Display Inc., Tokyo (JP); Panasonic Liquid Crystal Display Co., Ltd., Hyogo (JP)

(72) Inventor: Masahiro Teramoto, Mobara (JP)

(73) Assignees: Japan Display Inc., Tokyo (JP); Panasonic Liquid Crystal Display Co., Ltd., Hyogo (JP)

(*) Notice: Subject to any disclaimer, the term of this patent is extended or adjusted under 35 U.S.C. 154(b) by 0 days. days.

This patent is subject to a terminal disclaimer.

(21) Appl. No.: 15/704,040

(22) Filed: Sep. 14, 2017

(65) Prior Publication Data

US 2018/0004346 A1    Jan. 4, 2018

Related U.S. Application Data

(63) Continuation of application No. 15/586,340, filed on May 4, 2017, now Pat. No. 9,791,969, which is a continuation of application No. 15/279,516, filed on Sep. 29, 2016, now Pat. No. 9,671,917, which is a continuation of application No. 14/971,460, filed on Dec. 16, 2015, now Pat. No. 9,483,154, which is a
(Continued)

(30) Foreign Application Priority Data

Jul. 31, 2008   (JP) ................... 2008-197240

(51) Int. Cl.
*G06F 3/044* (2006.01)
*G06F 3/041* (2006.01)

(52) U.S. Cl.
CPC .......... *G06F 3/0416* (2013.01); *G06F 3/044* (2013.01); *G06F 3/0412* (2013.01); *G06F 2203/04111* (2013.01)

(58) Field of Classification Search
USPC ................................. 345/170–176
See application file for complete search history.

(56) References Cited

U.S. PATENT DOCUMENTS

| 7,202,855 B2 | 4/2007 | Shigetaka et al. |
| 8,436,830 B2 | 5/2013 | Teramoto |
| (Continued) | | |

FOREIGN PATENT DOCUMENTS

| JP | 2008-065748 A | 3/2008 |
| JP | 2009-015489 A | 1/2009 |

*Primary Examiner* — Tony Davis
(74) *Attorney, Agent, or Firm* — Typha IP LLC

(57) ABSTRACT

A touch panel includes a plurality of first electrodes, a plurality of second electrodes, and a plurality of wirings. Each of the plurality of first electrodes has a first portion formed on a layer different from that on which the second electrodes are formed and intersecting the second electrodes, and a second portion formed on the same layer as that on which the second electrodes are formed, but separated from the second electrode. The second electrode and the second portion of the first electrode are formed on a layer different than the layer where the wiring is formed. The first portion of the first electrode is connected to the second portion through a contact portion formed in an insulating film made of a negative resist between the first portion and the second electrode.

10 Claims, 6 Drawing Sheets

Related U.S. Application Data continuation of application No. 13/949,673, filed on Jul. 24, 2013, now Pat. No. 9,245,696, which is a continuation of application No. 12/510,488, filed on Jul. 28, 2009, now Pat. No. 8,502,802.

(56) References Cited

U.S. PATENT DOCUMENTS

| | | | | |
|---|---|---|---|---|
| 8,502,802 | B2* | 8/2013 | Teramoto | G06F 3/044 345/173 |
| 8,643,627 | B2 | 2/2014 | Teramoto | |
| 8,941,616 | B2 | 1/2015 | Teramoto | |
| 9,245,696 | B2* | 1/2016 | Teramoto | G06F 3/044 |
| 9,292,147 | B2 | 3/2016 | Teramoto | |
| 9,483,154 | B2* | 11/2016 | Teramoto | G06F 3/044 |
| 9,671,917 | B2* | 6/2017 | Teramoto | G06F 3/044 |
| 2003/0052867 | A1 | 3/2003 | Shigetaka et al. | |
| 2007/0182720 | A1 | 8/2007 | Fujii et al. | |
| 2007/0229470 | A1 | 10/2007 | Snyder et al. | |
| 2007/0242054 | A1 | 10/2007 | Chang et al. | |
| 2008/0309633 | A1 | 12/2008 | Hotelling et al. | |
| 2009/0009486 | A1 | 1/2009 | Sato et al. | |
| 2009/0262096 | A1 | 10/2009 | Teramoto | |
| 2010/0026661 | A1* | 2/2010 | Teramoto | G06F 3/044 345/174 |
| 2010/0066701 | A1 | 3/2010 | Ningrat | |
| 2013/0194233 | A1 | 8/2013 | Teramoto | |
| 2013/0306460 | A1* | 11/2013 | Teramoto | G06F 3/044 200/600 |
| 2014/0139485 | A1 | 5/2014 | Teramoto | |
| 2015/0122771 | A1 | 5/2015 | Teramoto | |
| 2016/0103528 | A1* | 4/2016 | Teramoto | G06F 3/044 345/174 |
| 2016/0162109 | A1 | 6/2016 | Teramoto | |
| 2017/0017321 | A1* | 1/2017 | Teramoto | G06F 3/044 |
| 2017/0235419 | A1* | 8/2017 | Teramoto | G06F 3/0416 345/174 |

* cited by examiner

RELATED ART

RELATED ART

TOUCH PANEL

CROSS-REFERENCE TO RELATED APPLICATIONS

This application is a continuation application of U.S. patent application Ser. No. 15/586,340, filed May 4, 2017, which, in turn, is a continuation application of U.S. patent application Ser. No. 15/279,516 (now U.S. Pat. No. 9,671,917), filed Sep. 29, 2016, which, in turn, is a continuation application of U.S. patent application Ser. No. 14/971,460 (now U.S. Pat. No. 9,483,154), filed Dec. 16, 2015, which, in turn, is a continuation of U.S. patent application Ser. No. 13/949,673 (now U.S. Pat. No. 9,245,696), filed Jul. 24, 2013, which, in turn, is a continuation of U.S. patent application Ser. No. 12/510,488 (now U.S. Pat. No. 8,502,802), filed Jul. 28, 2009, the contents of which are incorporated herein by reference. Further, this application claims priority from Japanese application No. 2008-197240 filed on Jul. 31, 2008, the entire contents of which are hereby incorporated by reference into this application.

BACKGROUND OF THE INVENTION

1. Field of the Invention

The present invention relates to a touch panel-equipped display device, and in particular to a touch panel-equipped display device having a static capacitance coupling type touch panel.

2. Description of the Related Art

As major types of touch panels, there are known a type for detecting an optical change and a type for detecting change in electrical characteristic. As a type for detecting change in electrical characteristic, a static capacitance coupling type is known (see Japanese Patent Laid-open Publication No. 2008-65748 and Japanese Patent Laid-open Publication No. 2009-015489).

According to a conventional static capacitance coupling type touch panel, disclosed in the above-described Japanese Patent Laid-open Publication No. 2008-65748 and Japanese Patent Laid-open Publication No. 2009-015489, a plurality of electrodes (X electrodes) and a plurality of electrodes (Y electrodes) are formed on different electrically conductive layers (a lower layer and an upper layer), respectively, via an insulating film. For the above described electrode structure, the insulating film and a protective film formed on an electrode on the upper layer are distorted due to the electrode on the upper layer. In addition, as the optical path length for reflected light is different between the lower layer and the upper layer, a color difference is caused between an electrode on the lower layer (e.g., the X electrode) and an electrode (e.g., the Y electrode) on the upper layer, which causes an electrode pattern of the electrodes on the upper and lower layers to appear to become noticeable. An electrode pattern having been appeared to be noticeable, as described above, will deteriorate optical characteristic, resulting in deterioration in characteristic of the display device with a touch panel mounted therein.

In view of the above, the present applicant has proposed a touch panel adopting a new electrode structure, and already filed a patent application therefor (U.S. patent application Ser. No. 12/427,878).

FIGS. 6 to 8 are diagrams related to an electrostatic capacitance type touch panel for which the present applicant has already filed a patent application. In particular, FIG. 6 is a plan view showing an electrode pattern of a touch panel; FIG. 7 is a cross sectional view showing a cross sectional structure along the line VII-VII in FIG. 6; and FIG. 8 is a cross sectional view showing a cross sectional structure along the line VIII-VIII in FIG. 6.

In the touch panel shown in FIGS. 6 to 8, an electrode 1X has a first portion 1a and a second portion 1b. The first portion 1a is formed on a layer different from the layer on which electrode 2Y is formed, so as to intersect the electrode 2Y. The second portion 1b is formed on the same layer as that where the electrode 2Y is formed, but separated from the electrode 2Y. The first portion 1a is connected to the second portion 1b in a contact hole 12a formed on an insulating film 12 between the first portion 1a and the electrode 2Y. For this electrode structure, a protective film 13 can be formed having a consistent surface so that the distortion of the protective film 13 can be suppressed, and therefore, appearance of an electrode pattern due to color difference due to distortion of the protective film 13 can be suppressed. As a result, as deterioration of optical characteristic due to an appeared electrode pattern can be suppressed, deterioration in characteristic of a display device with the touch panel mounted therein can be suppressed.

Further, as a portion with color difference caused can be minimized to the first portion 1a of the electrode 1X alone, an appeared electrode pattern due to color difference due to difference in an optical path length can be suppressed. As a result, as deterioration in optical characteristic due to an appeared electrode pattern can be suppressed, deterioration in characteristic of the display device with the touch panel 20 mounted therein can be suppressed.

Still further, when a defect is caused in the first portion 1a (bridge portion) formed on the upper layer, the defect can be repaired by carrying out again a process for forming the first portion 1a. That is, deterioration in optical characteristic due to an appeared electrode pattern can be suppressed so that processability can be improved.

However, in the touch panel shown in FIGS. 6 to 8, formation of an upper layer electrode (the first portion 1a of the electrode 1X) on the insulating film 12 is inefficient in view of process, material, and costs as requiring material and process similar to those required in formation of a lower layer electrode (the second portion of the electrode 1X and the electrode 1Y) under the insulating film 12, although the area for formation is very small. Such inefficiency needs to be addressed, or otherwise causing increase of the cost of a display device with the touch panel mounted therein.

In view of the above, the present inventor takes notice of the wiring electrically connected to the matrix electrodes (electrodes 1X and 1Y) in achieving the present invention.

SUMMARY OF THE INVENTION

An object of the present invention is to provide a technique capable of reducing costs of a touch panel-equipped display device. The above described and other objects and new characteristics of the present invention will become obvious in view of the description in this specification and the accompanying drawings.

A representative invention among those disclosed in this application will be outlined as below.

(1) According to one aspect of the present invention, there is provided a touch panel-equipped display device comprising a display panel; and an electrostatic capacitance type touch panel arranged on a surface of the display panel, the surface closer to a viewer, wherein the touch panel includes a plurality of first electrodes formed on the substrate, extending in a first direction and being aligned in parallel in a second direction intersecting the first direction, a plurality of second electrodes formed on the substrate, extending in the second direction so as to intersect the first electrodes and being aligned in parallel in the first direction, and a plurality of wirings electrically connected to the plurality of respective first electrodes and the plurality of respective second electrodes, each of the plurality of first electrodes has a first portion formed on a layer different from a layer on which the second electrodes are formed and intersecting the second electrodes, and a second portion formed on the layer on which the second electrodes are formed, but separated from the second electrodes, the second electrodes and the second portions of the first electrodes are formed on a layer upper than a layer where the wirings are formed, and the first portions of the first electrodes are connected to the second portions in a contact hole formed on an insulating film between the first portions and the second electrodes, and formed on the layer where the wirings are formed.

(2) In the above described touch panel-equipped display device (1), the second electrodes and the second portions of the first electrodes may be formed using electrically conductive transparent material, while the wirings and the first portions of the first electrodes may be formed using electrically conductive metal material having a lower resistance value than that of the second electrodes and the second portions of the first electrodes.

(3) In the above described touch panel-equipped display device (1) or (2), the second electrode may have a portion, located between the adjacent first electrodes, wider than another portion thereof which intersects the first electrode, and the second portion of the first electrode may be formed wider between the adjacent second electrodes than the first portion of the first electrode.

(4) In any of the above described touch panel-equipped display devices (1) to (3), the display panel may have a display area where a plurality of pixels are arranged, and a non-display area provided around the display area; the first and second electrodes may be arranged in an area opposed to the display area of the display panel; and the wirings may be arranged in an area opposed to the non-display area of the display panel.

(5) Any of the above described touch panel-equipped display devices (1) to (4) may further comprise a protective film formed on the substrate so as to cover the first and second electrodes.

According to the present invention, cost reduction for a touch panel-equipped display device can be attained.

DETAILED DESCRIPTION OF THE INVENTION

In the following, an embodiment of the present invention will be described in detail referring to the accompanying drawings. Note that, in all drawings for explaining an embodiment of the present invention, a member having an identical function is referred to by an identical reference number and an explanation thereof is not repeated.

In this embodiment, an example in which the present invention is applied to a touch panel-equipped display device having a touch panel on, e.g., a liquid crystal display panel as an example of a display panel is described.

FIGS. 1 to 5 are drawings related to a touch panel-equipped display panel according to one embodiment of the present invention.

Figure 1:
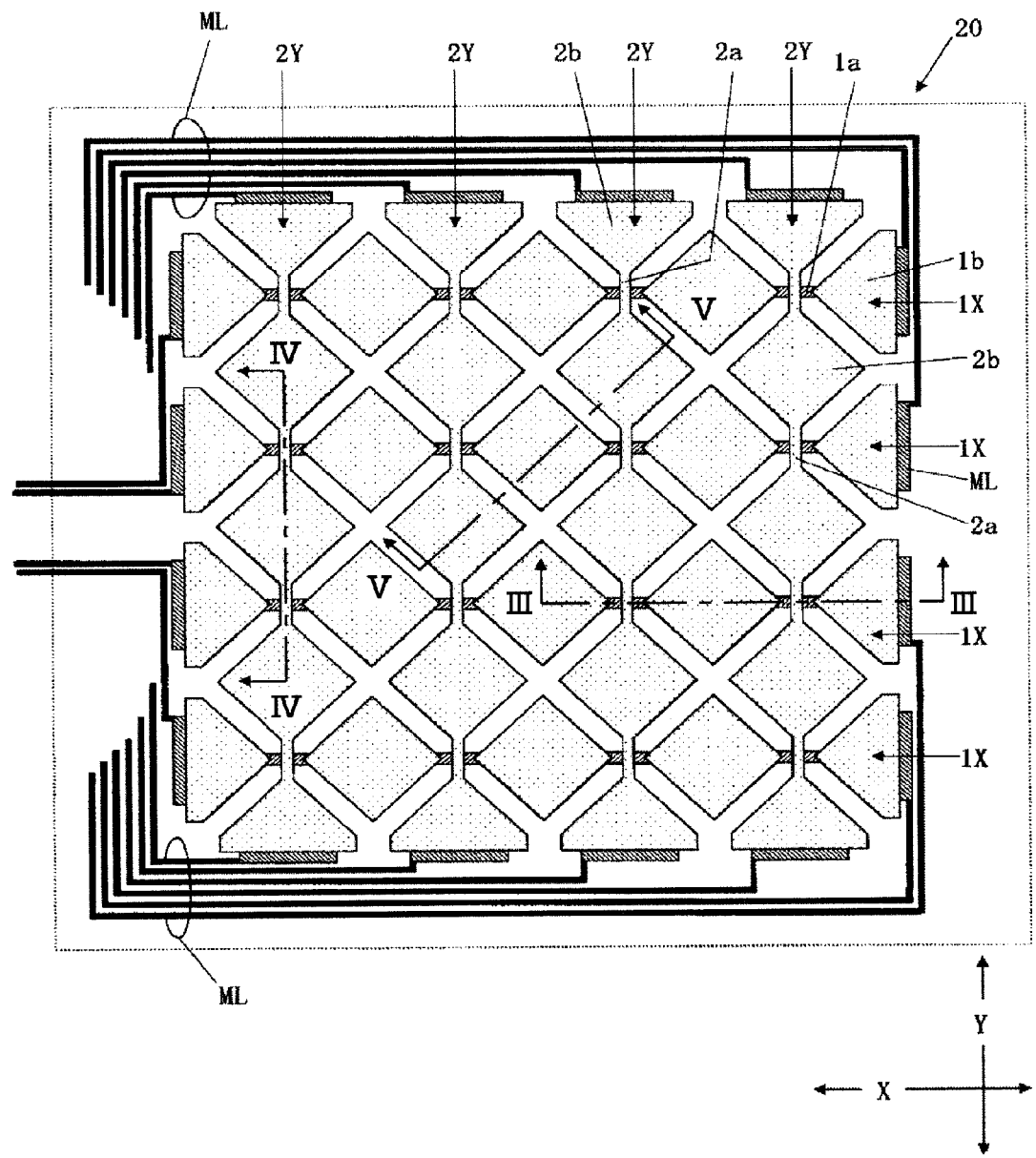
FIG. 1 is a plan view showing an electrode pattern of a touch panel mounted in a touch panel-equipped display device according to one embodiment of the present invention.
Figure 2:
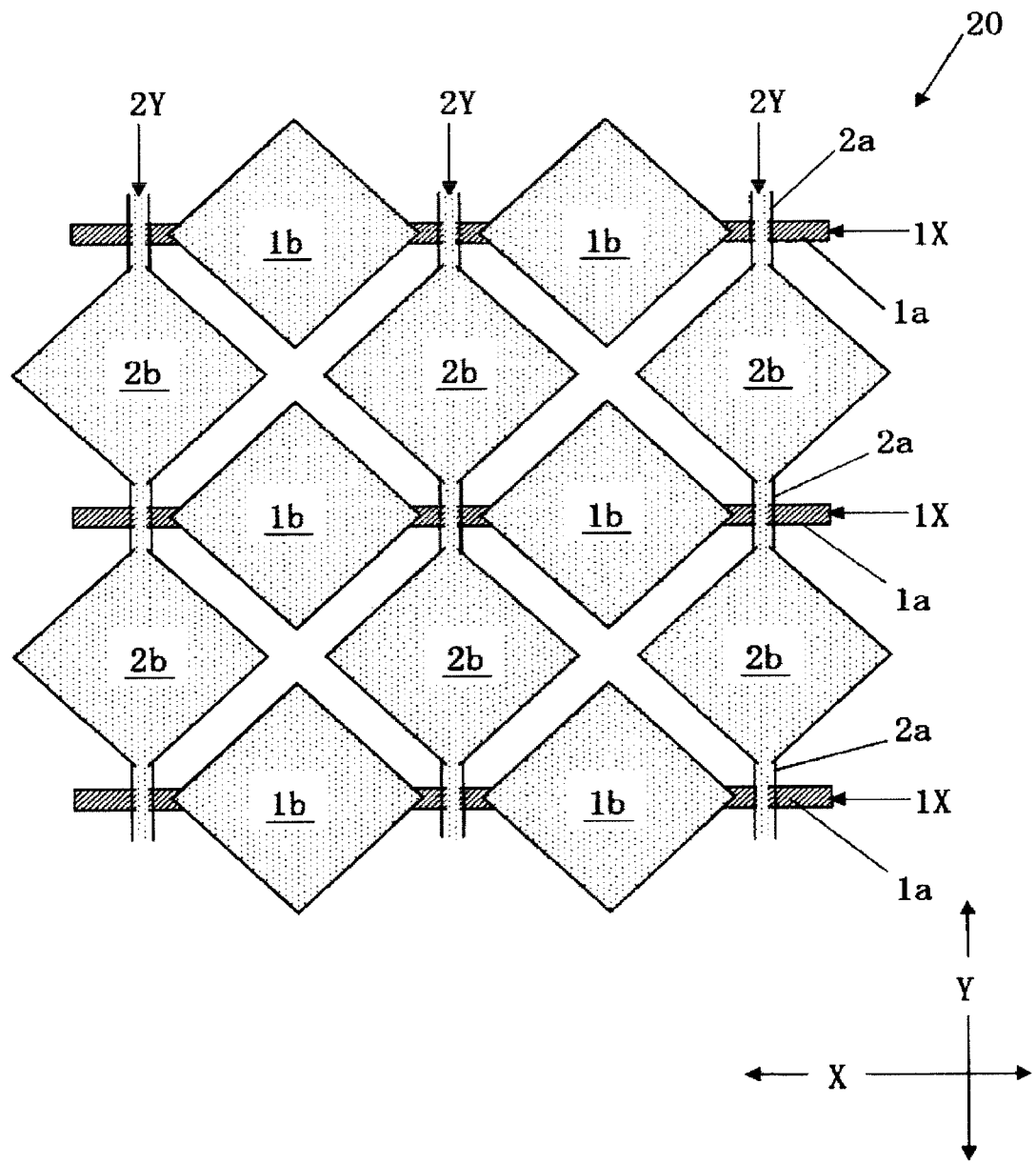
FIG. 2 is an enlarged plan view showing a part shown in FIG. 1.
Figure 3:
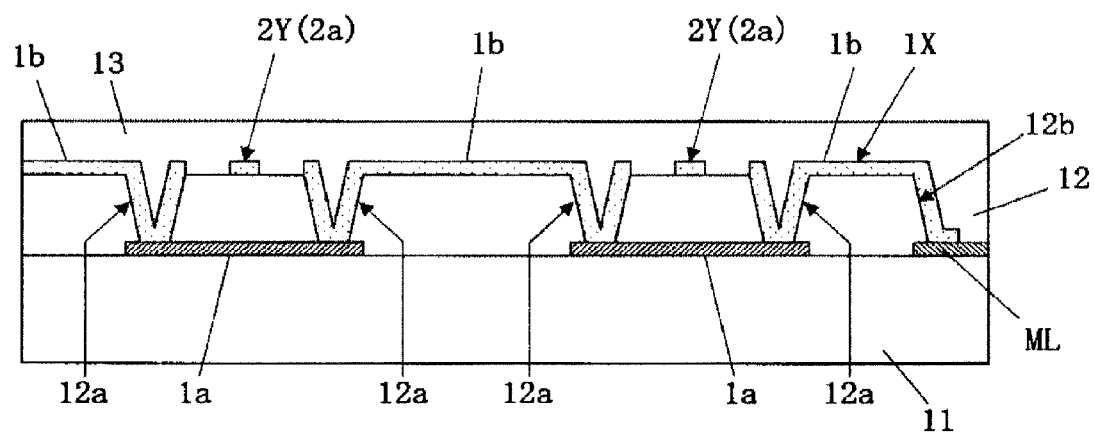
FIG. 3 is a cross sectional view showing a cross sectional structure along the line in FIG. 1.
Figure 4:
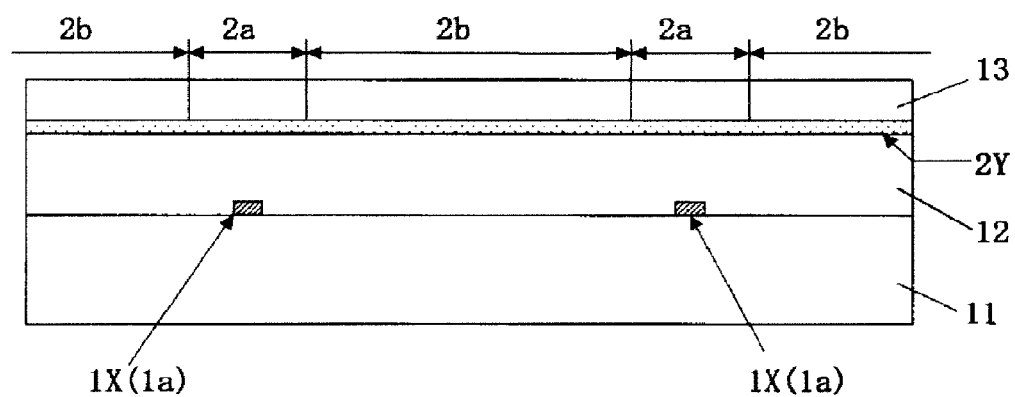
FIG. 4 is a cross sectional view showing a cross sectional structure along the IV-IV in FIG. 1.
Figure 5:
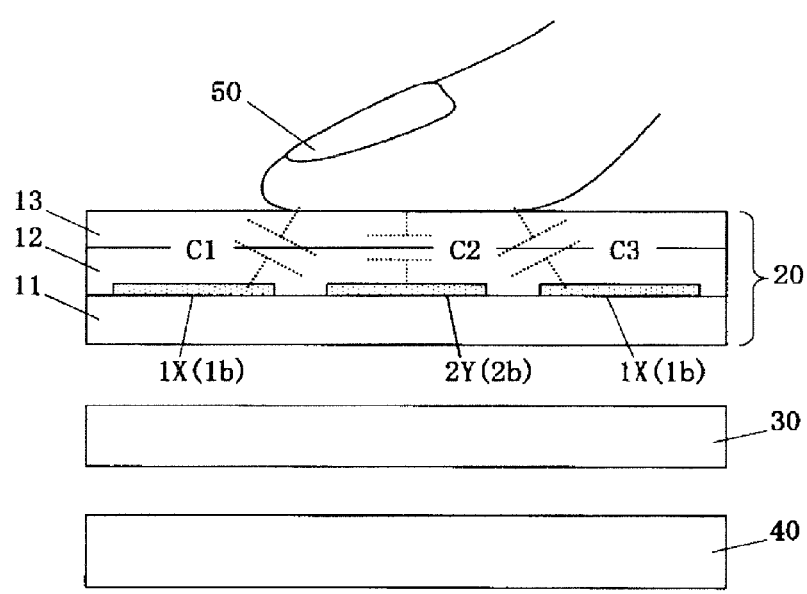
FIG. 5 is a block diagram showing a schematic structure of a touch panel-equipped display device according to one embodiment of the present invention.

FIG. 1 is a plan view showing an electrode pattern of a touch panel mounted in a touch panel-equipped display device. FIG. 2 is an enlarged plan view showing a part shown in FIG. 1. FIG. 3 is a cross sectional view showing a cross sectional structure along the line III-Ill in FIG. 1. FIG. 4 is a cross sectional view showing a cross sectional structure along the line IV-IV in FIG. 1. FIG. 5 is a block diagram showing a schematic structure of a touch panel-equipped display device.

Note that FIG. 5 shows a cross sectional structure of the touch panel 20 along the line V-V in FIG. 1.

A touch panel-equipped display device in this embodiment, as shown in FIG. 5, comprises a liquid crystal display panel 30, an electrostatic capacitance type touch panel 20 arranged on a surface of the liquid crystal display panel 30, the surface closer to a viewer, and a backlight 40 arranged under a surface of the liquid crystal display panel 30, the surface farther from the viewer. As a liquid crystal display panel 30, a liquid crystal display panel of, e.g., IPS type, TN type, VA type, or the like, is used. The liquid crystal display panel 30 has a display area where a plurality of pixels are arranged in a matrix and a non-display area provided around the display area. Each of the plurality of pixels has a pixel electrode and an opposed electrode. In the non-display area, a light shielding film, such as a black matrix, is provided.

The touch panel 20, as shown in FIGS. 1 to 4, comprises a plurality of electrodes 1X and a plurality of electrodes 2Y. The electrodes 1X extend in a first direction (e.g., the X direction) and are aligned in parallel in a second direction (e.g., the Y direction) intersecting the first direction at a predetermined alignment pitch. The electrodes 2Y extend in the second direction so as to intersect the electrodes 1X and are aligned in parallel in the first direction at a predetermined alignment pitch.

Each of the plurality of electrodes 2Y is formed having an electrode pattern in which a plurality of first portions 2a and a plurality of second portion 2b, each being wider than the first portion 2a, are alternately arranged in the second direction. Each of the plurality of electrodes 2Y is arranged on the surface of the substrate 11, closer to the viewer, via an insulating film 12, and further covered by a protective film 13 formed thereon. As the substrate 11, a transparent insulating substrate, e.g., glass, or the like, is used.

Each of the plurality of electrodes 1X is formed having an electrode pattern in which a plurality of first portions 1a and a plurality of second portions 1b, each being wider than the first portion 1a, are alternately arranged in the first direction. The first portion 1a of each of the plurality of electrodes 1X is formed on an electrically conductive layer different from that on which the electrode 2Y is formed, and as viewed two-dimensionally intersects the first portion 2a of the electrode 2Y. The second portion 1b of each of the plurality of electrodes 1X is formed on the same electrically conductive layer as that on which the electrode 2Y is formed, but separated from the electrode 2Y. In this embodiment, the first portion 1a of the electrode 1X is formed on a layer lower than that of the electrode 2Y.

Similar to the electrode 2Y, the second portion 1b of each of the plurality of electrodes 1X is arranged on the surface of the substrate 11, closer to the viewer, via the insulating film 12, and covered by the protective film 13 formed thereon. The first portion 1a of each of the plurality of electrodes 1X is arranged on the surface of the substrate 11, closer to the viewer, and covered by the insulating film 12 formed thereon.

The first portion 1a of the electrode 1X, as viewed two-dimensionally, intersects the first portion 2a of the electrode 2Y, and electrically and mechanically connected to two second portions 1b, respectively, which are arranged adjacent to each other with the first portion 2a in-between, in a contact hole 12a formed on the insulating film 12 which serves as an inter-layer insulating film between the first portion 1a of the electrode 1X and the electrode 2Y.

That is, each of the plurality of electrodes 1X is formed on an electrically conductive layer different from that on which the electrode 2Y is formed, and has the first portion 1a intersecting the electrode 2Y and the second portion 1b formed on the same electrically conductive layer as that on which the electrode 2Y is formed, but separated from the electrode 2Y. The first portion 1a of the electrode 1X is electrically connected to the second portion 1b of the electrode 1X in the contact hole 12a formed on the insulating film 12 between the first portion 1a and the electrode 2Y.

The second portion 2b of the electrode 2Y is arranged, as viewed two-dimensionally, between the first portions 1a of two adjacent electrodes 1X. The second portion 1b of the electrode 1X is arranged, as viewed two-dimensionally, between the first portions 2a of two adjacent electrodes 2Y.

That is, the electrode 2Y has a portion, located between two adjacent electrodes 1X, wider than that of another portion thereof intersecting the electrodes 1X, while the electrode 1X has a portion, located between two adjacent electrodes 2Y, wider than that of another portion thereof intersecting the electrodes 2Y.

The touch panel 20 comprises a central area where a plurality of electrodes 1Y and 1X are arranged and a peripheral area provided around the central area. As shown in FIG. 1, a plurality of wirings ML electrically connected to each of the plurality of electrodes 1Y and 1X are provided in the peripheral area of the touch panel 20. The plurality of respective wirings ML electrically connect the plurality of respective electrodes 1Y and 1X to a touch position control circuit.

The central area of the touch panel 20 is arranged so as to correspond to the display area of the liquid crystal display panel 30, while the peripheral area of the touch panel 20 is arranged so as to correspond to the non-display area of the liquid crystal display panel 30. That is, the plurality of electrodes 1X and 1Y of the touch panel 20 are arranged in an area opposed to the display area of the liquid crystal display panel 30, while the plurality of wirings ML are arranged in an area opposed to the non-display area of the liquid crystal display panel 30.

As shown in FIG. 3, each of the plurality of wirings ML is arranged on the surface of the substrate 11, the surface closer to the viewer, and covered by an insulating film 12 formed thereon. The first portion 1a of each of the plurality of electrodes 1X is formed on the same electrically conductive layer as that where the plurality of wirings ML are formed. That is, the first portion 1a of each of the plurality of electrodes 1X is formed simultaneously with the plurality of wirings ML, which are formed by patterning an electrically conductive film. Each of the plurality of wirings ML is electrically connected to a corresponding electrode (electrodes 1Y and 1X) at a terminal of the electrode (electrode 1Y and 1X) via a connection portion 12b formed on the insulating film 12, as shown in FIG. 3.

Note that the second portion 1b of the electrode 1X and the electrode 1Y are formed using electrically conductive transparent material, e.g., ITO (Indium Tin Oxide), or the like, having high transmissivity. Meanwhile, the first portion 1a of the electrode 1X and the wiring ML are formed using electrically conductive metal material, e.g., silver alloy, having a lower resistance value than that of the second portion 1b of the electrode 1X and the electrode 1Y.

Note that, in FIG. 5, presence of capacitances C1, C3 between the finger 50 of a viewer and the electrode 1X and that of a capacitance C2 between the finger 50 of a viewer and the electrode 2Y are schematically illustrated. The touch panel 20 according to this embodiment detects a capacitance difference in coupling capacitance between the electrodes 1X and 2Y to thereby detect the touch position coordinates of a position on the touch panel 20, touched by the finger 50 of a viewer.

In the following, a method for manufacturing the touch panel 20 in this embodiment is described referring to FIGS. 1 to 4.

Initially, a first electrically conductive film is formed on the surface of the substrate 11, closer to a viewer, using electrically conductive metal material (e.g., silver alloy) having a lower resistance value than that of electrically conductive transparent material (e.g., ITO).

Subsequently, a first mask including a wiring pattern and an electrode pattern is formed on the first electrically conductive film, using, e.g., positive resist, and the first electrically conductive film is etched using the first mask as an etching mask to thereby form the wiring ML and the first portion 1a of the electrode 1X on the substrate 11.

Thereafter, the first mask is removed, and an insulating film 12 is formed using, e.g., negative resist on the substrate 11 including the wiring ML and the first portion 1a of the electrode 1X. At this process, the wiring ML and the first portion 1a of the electrode 1X are covered by the insulating film 12.

Thereafter, the contact hole 12a and the connection portion 12b are formed at suitable positions on the insulating film 12, and a second electrically conductive film is then formed using electrically conductive transparent material (e.g., ITO) on the insulating film 12 including inside the contact hole 12a and the connection portion 12b.

Further, a second mask including an electrode pattern is formed on the second electrically conductive film, using, e.g., positive resist, and the second electrically conductive film is etched using the second mask as an etching mask to thereby form the second portion 1b of the electrode 1X and the electrode 1Y on the insulating film 12. At this step, the second portion 1b on the upper layer is electrically and mechanically connected to the first portion 1a on the lower layer in the contact hole 12a. Further, the first portion 1a on the lower layer intersects the first portion 1a of the electrode 2Y on the upper layer. Also, the respective ends of the electrodes 1X and 1Y are electrically and mechanically connected to the corresponding wirings ML on the lower layer via the connection portion 12b.

Thereafter, the second mask is removed, and the protective film 13 is formed, using, e.g., negative resist on the insulating film 12 including the second portion 1b of the electrode 1X and the electrode 1Y. With the above, the structure shown in FIGS. 1 to 4 is formed. At this step, the second portion 1b of the electrode 1X and the electrode 1Y are covered by the protective film 13.

Note that formation of the peripheral wiring pattern can be carried out appropriately between the above described steps.

Figure 6:
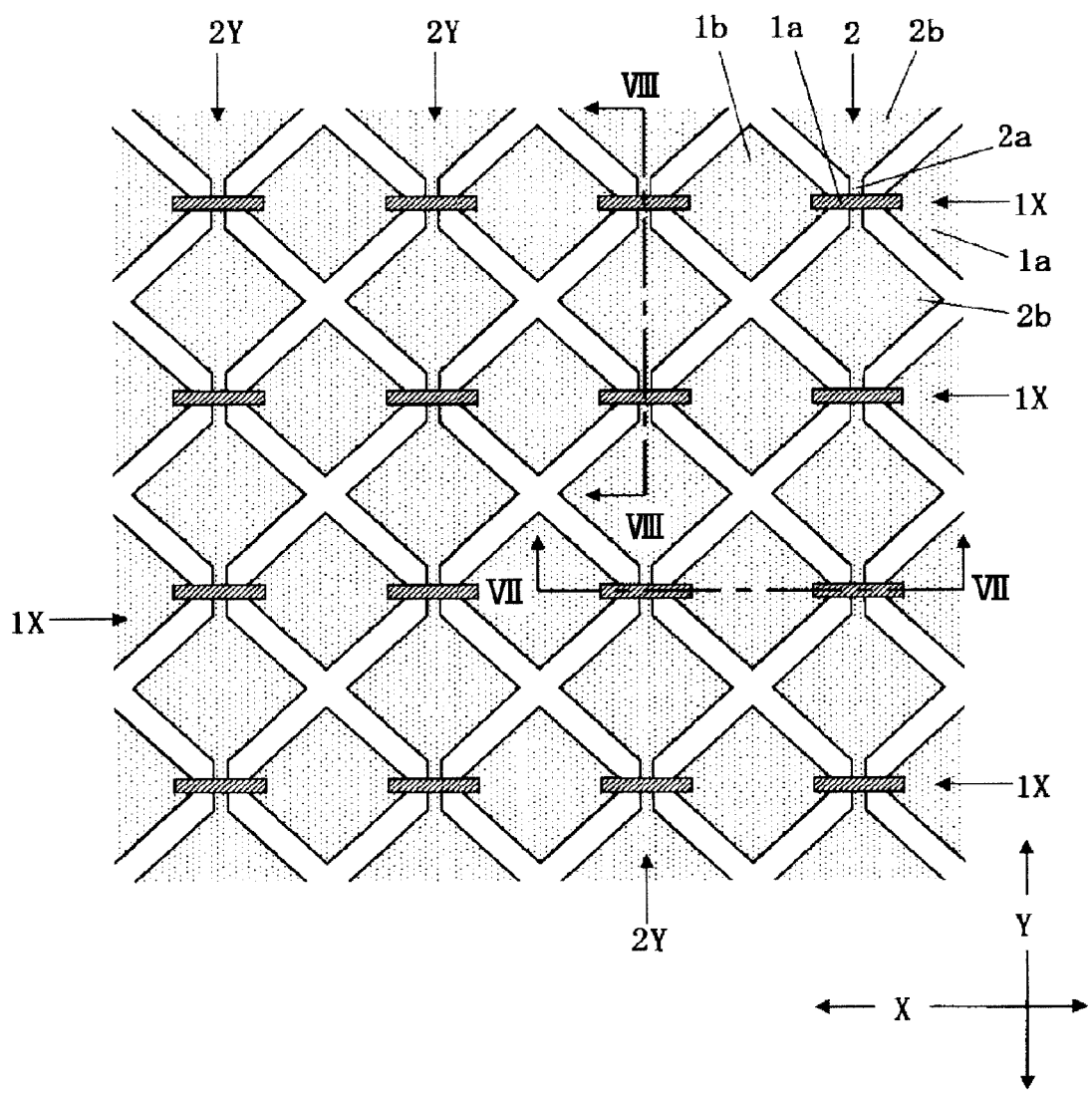
FIG. 6 is a plan view showing an electrode pattern of an electrostatic capacitance type touch panel for which a patent application has been filed by the present applicant.
Figure 7:
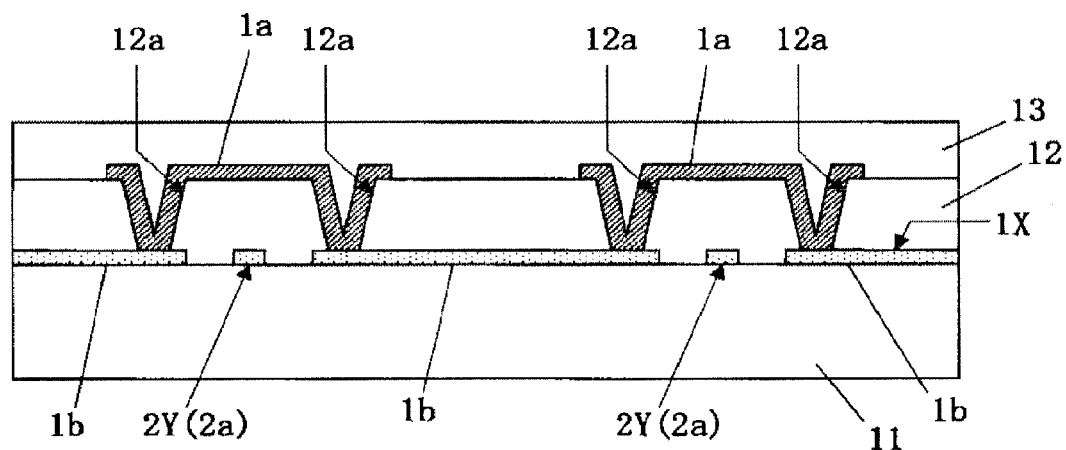
FIG. 7 is a cross sectional view showing a cross sectional structure along the line VII-VII in FIG. 6.
Figure 8:
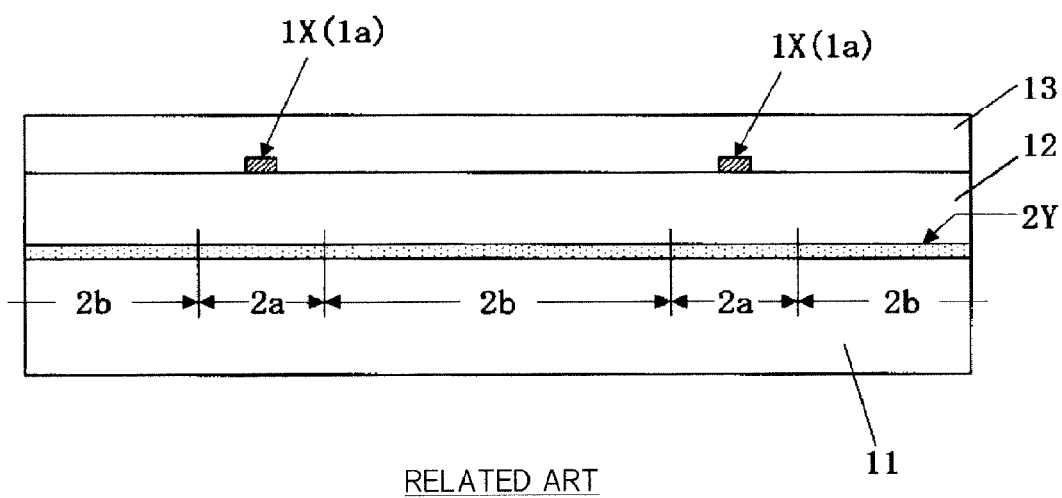
FIG. 8 is a cross sectional view showing a cross sectional structure along the line VIII-VIII in FIG. 6.

Note that, for the touch panel shown in FIGS. 6 to 8, formation of an upper layer electrode (the first portion 1a of the electrode 1X) on the insulating film 12 requires similar material and process to that which is required in formation of a lower layer electrode (the second portion of the electrode 1X and the electrode 1Y), although an area for formation is very small.

On the contrary, for the electrostatic capacitance type touch panel 20 according to the present invention, as shown in FIGS. 1 to 4, the first portion 1a of the electrode 1X is formed on the same electrically conductive layer as that on which the wiring ML is formed. Such an electrode structure can eliminate the layer required for the first portion 1a of the electrode 1X in the touch panel shown in FIGS. 6 to 8, and therefore involved material and process can be omitted. This enables production of a further inexpensive touch panel, and thus achieves cost reduction for a touch panel-equipped display device with a touch panel mounted therein.

Further, as majority (except the first portion 1a of the electrode 1X) of the matrix electrodes comprising the electrodes 1X and 1Y are formed on the same layer, using electrically conductive transparent material, problematic appearance of an electrode pattern due to color difference due to difference in light path length for reflected light and distortion of the insulating film and the protective film can be suppressed so that preferable optical characteristic can be realized.

Still further, as the first portion 1a of the electrode 1X is formed using electrically conductive material (e.g., silver alloy) having a lower resistance value than that of the electrode 2Y and the second portion 1b of the electrode 1X, lower resistance of one electrode line comprising one electrode 1X can be attained.

Note that, although an example in which the first portion 1a of the electrode 1X and the wiring ML are formed on the same layer is described in the above, obviously, the present invention can be applied to a case in which the first portion 2a of the electrode 1Y and the wiring ML are formed on the same layer.

Further, although a touch panel-equipped display device having a touch panel formed on a liquid crystal display panel as an example of a display panel is described in the above, obviously, application of the present invention is not limited to the above example, and the present invention can be applied to a touch panel-equipped display device having a touch panel formed on a different type of display panel, such as an organic EL display panel, an inorganic EL display panel, or the like.

Although an invention having been attained by the present inventor has been specifically described based on the above described embodiment, the present invention is not limited to the above described embodiment and can be modified in a variety of manners not departing from the gist of the present invention.

What is claimed is:

1. A touch panel, comprising:
   a substrate;
   a plurality of first electrodes on the substrate, extending in a first direction, each of the plurality of first electrodes having first portions on a first layer, each of the plurality of first electrodes having second portions on a second layer different from the first layer;
   a plurality of second electrodes on the second layer extending in a second direction so as to three-dimensionally intersect the respective plurality of first electrodes;
   a plurality of wirings electrically connected to respective electrodes among the plurality of first electrodes and the plurality of second electrodes in a peripheral area of the substrate; and
   a protective film above the plurality of first electrodes and the plurality of second electrodes, wherein
   the first portions three-dimensionally intersect the respective plurality of second electrodes, and the second portions are separated from the plurality of second electrodes,
   each of the first portions electrically connects adjacent two portions among the second portions at an intersection,
   each of the first portions is separated from the second electrodes through an insulating film at the intersection,
   the plurality of wirings overlap with the first electrodes and the second electrodes in the peripheral area and separated from the first electrodes and the second electrodes through the insulating film,
   each of the plurality of wirings is electrically connected to corresponding one of the first electrodes and the second electrodes by a connection portion formed on the insulating film in the peripheral area,
   the plurality of wirings and the connection portion are covered with the protective film, and
   each of the first portions and the plurality of wirings are made of a same metal material.

2. The touch panel according to claim 1, wherein the metal material is made of a same layer.

3. The touch panel according to claim 1, wherein the plurality of second electrodes and the second portions are formed of electrically conductive transparent materials.

4. The touch panel according to claim 1, wherein each of the plurality of second electrodes has a portion, located between adjacent two electrodes of the plurality of first electrodes, wider than another portion thereof which three dimensionally intersects corresponding one of the first portions, and the second portions are formed wider between adjacent two electrodes of the plurality of second electrodes than the first portions.

5. The touch panel according to claim 1, the protective film is a resist.

6. A touch panel, comprising:
   a substrate;
   a plurality of first electrodes on the substrate, extending in a first direction, each of the plurality of first electrodes having first portions on a first layer, each of the plurality of first electrodes having second portions on a second layer different from the first layer;

a plurality of second electrodes on the second layer extending in a second direction so as to three-dimensionally intersect the respective plurality of first electrodes;

a plurality of wirings electrically connected to respective electrodes among the plurality of first electrodes and the plurality of second electrodes in a peripheral area of the substrate; and a protective film above the plurality of first electrodes and the plurality of second electrodes, wherein the first portions three-dimensionally intersect the respective plurality of second electrodes, and the second portions are separated from the plurality of second electrodes, each of the first portions electrically connects adjacent two portions among the second portions at an intersection, each of the first portions is separated from the second electrodes through an insulating film at the intersection, each of the plurality of wirings is electrically connected to corresponding one of the first electrodes and the second electrodes through a connection portion which is provided on the insulating film in the peripheral area, the plurality of wirings and the connection portion are covered with the protective film, the plurality of wirings and the first portions are made of a same metal material, and a width of the connection portion is greater than that of the first portions.

7. The touch panel according to claim 6, wherein the metal material is made of a same layer.

8. The touch panel according to claim 6, wherein the plurality of second electrodes and the second portions are formed of electrically conductive transparent materials.

9. The touch panel according to claim 6, wherein each of the plurality of second electrodes has a portion, located between adjacent two electrodes of the plurality of first electrodes, wider than another portion thereof which three dimensionally intersects corresponding one of the first portions, and the second portions are formed wider between adjacent two electrodes of the plurality of second electrodes than the first portions.

10. The touch panel according to claim 6, the protective film is a resist.

* * * * *